United States Patent
Rahman et al.

(10) Patent No.: US 7,868,599 B2
(45) Date of Patent: Jan. 11, 2011

(54) METHOD OF OPTIMUM CURRENT BLANKING TIME IMPLEMENTATION IN CURRENT SENSE CIRCUIT

(75) Inventors: Md Abidur Rahman, Allen, TX (US); Huijuan Li, Plano, TX (US); Brett E. Smith, Mckinney, TX (US); Zheng Li, Farmers Branch, TX (US)

(73) Assignee: Texas Instruments Incorporated, Dallas, TX (US)

( * ) Notice: Subject to any disclaimer, the term of this patent is extended or adjusted under 35 U.S.C. 154(b) by 489 days.

(21) Appl. No.: 11/986,775

(22) Filed: Nov. 26, 2007

(65) Prior Publication Data

US 2009/0134856 A1    May 28, 2009

(51) Int. Cl.
*G05F 1/00* (2006.01)
(52) U.S. Cl. .................................. 323/282; 323/288
(58) Field of Classification Search ................ 323/277, 323/282–284, 288
See application file for complete search history.

(56) References Cited

U.S. PATENT DOCUMENTS

| | | | | |
|---|---|---|---|---|
| 5,418,410 A | * | 5/1995 | Tisinger | 327/77 |
| 6,528,976 B1 | * | 3/2003 | Lenk et al. | 323/282 |
| 6,664,773 B1 | * | 12/2003 | Cunnac et al. | 323/277 |
| 6,677,738 B1 | * | 1/2004 | Hesse | 323/284 |
| 7,119,524 B2 | * | 10/2006 | Bretz et al. | 323/274 |
| 7,408,388 B2 | * | 8/2008 | Nagasawa et al. | 327/110 |
| 7,598,715 B1 | * | 10/2009 | Hariman et al. | 323/271 |
| 2008/0030178 A1 | * | 2/2008 | Leonard et al. | 323/282 |
| 2008/0315853 A1 | * | 12/2008 | Capilla et al. | 323/288 |
| 2009/0134856 A1 | * | 5/2009 | Rahman et al. | 323/282 |

* cited by examiner

*Primary Examiner*—Adolf Berhane
*Assistant Examiner*—Yemane Mehari
(74) *Attorney, Agent, or Firm*—William B. Kempler; Wade J. Brady, III; Frederick J. Telecky, Jr.

(57) ABSTRACT

In a method and system for sensing current in a switching regulator (SWR) operating in a current mode, a power switch is coupled to receive the current from a switching element, the power switch being controlled by a gate signal. An inrush of the current causes an initial transient spike (ITS). A buffer having a buffer input and a buffer output is coupled to receive the gate signal and provide a buffered gate signal. The buffer output is disabled during the ITS. A sense switch (SW) is coupled to receive a portion of the current from the switching element, the SW being turned on by the buffered gate signal after the initial transient spike. A sense resistor (SR) is coupled to receive the portion of the current from the SW. An amplifier converts the portion of the current through the SR to a voltage signal for controlling the SWR.

17 Claims, 5 Drawing Sheets

METHOD OF OPTIMUM CURRENT BLANKING TIME IMPLEMENTATION IN CURRENT SENSE CIRCUIT

BACKGROUND

The present disclosure relates generally to the field of switching power supplies, and more particularly to techniques for improved sensing of current flowing through the switching power supplies.

Switching power supplies such as a direct current-to-direct current (DC-DC) converter, switching regulator, and the like, have been used to provide direct current (DC) power to electrical/electronic devices such as integrated circuits (ICs), digital signal processors, radio frequency (RF) circuit devices such as cellular telephones, entertainment devices, portable computers, and the like, due to their improved power conversion efficiency compared to non-switching regulators. Switching DC-DC converters regulate an average DC output voltage by selectively storing energy in an energy storing element such as an inductor during a charge cycle, e.g., during an on time of a switching element. The energy stored in the inductor is selectively transferred to charge an output capacitor in discrete packets during a discharge cycle, e.g., during an off time of the switching element. Thus, the charge and discharge cycles are controlled by the switching element such as a field effect transistor (FET) by adjusting the on time and off time of a current flowing through the inductor.

Depending on the application, the switching regulators may be typically configured to operate in various well-known modes of control, including a voltage mode, a current mode, and a hysteric (or bang-bang) mode. In the current mode of control, a feedback control loop in a switching regulator is configured to measure a current flowing through the inductor and this current, upon being converted to a voltage, is used as feedback to control the output voltage. A well-known phenomenon associated with current mode switching regulators is a presence of an initial transient spike in the current when the power FET is turned on. The initial transient spike, which is generally caused by presence of parasitic capacitances and diode reverse recovery, may contribute to a loss of voltage regulation. A current blanking circuit having a particular time delay is often deployed to blank out the initial transient spike.

FIG. 1A illustrates a block diagram of a traditional current blanking circuit 100, according to prior art. In the depicted embodiment, the traditional current blanking circuit 100 includes a power FET 110 coupled in parallel with a sense FET 120. A drain of the power FET 110 is coupled to a drain of the sense FET 120 both being coupled to a switching input node 130, the gates of the power FET 110 and the sense FET 120 are coupled to one another, and a source of the power FET 110 is coupled to a ground reference 150. The operation of the power FET 110 and the sense FET 120 is controlled by a voltage signal that is provided by a gate driver 112 to the respective gates. A voltage level at the switching input node 130 switches between an on state and an off state, thereby enabling storing or discharging of energy in an energy storage element (not shown). A sense resistor 140 is coupled in series between a source of the sense FET 120 and the ground reference 150. When both the power FET 110 and the sense FET 120 are turned on, current flows through the parallel paths, the current being divided in proportion to the impedance of each path. A current 172 flowing through the power FET 110 is typically much greater than a current 174 flowing through the sense FET 120, e.g., by a factor of tens of thousands. An amplifier 160 converts the current sensed by the sense FET 120 into a voltage Vlfb_sen 162.

FIG. 1B illustrates transient waveforms associated with the traditional current blanking circuit 100 described with reference to FIG. 1A, according to prior art. Referring to FIGS. 1A and 1B, at time t0 180 when the power FET 110 is turned on, there is a leading edge spike 170 and 171 respectively on the transient waveforms of the current 172 flowing through the power FET 110 and the current 174 flowing through the sense FET 120. The leading edge spike 170 and 171 are caused by the presence of parasitic capacitances and by the reverse recovery phenomenon associated with the FET switches. The presence of the leading edge spike 170 and 171 causes an output of the amplifier 160 to take a large amount of time (e.g., from t1 181 to t2 182) to settle down and generate a voltage equivalent value that is indicative of the current flowing through the power FET 110.

The traditional current blanking circuit 100 includes a delay unit 180 and an output blanking switch 183 in a feed-forward path to reduce the impact of the leading edge spike 170. The delay unit 180 and the output blanking switch 183 are operable to blank out or zero out the output Vlfb_sen 162 of the amplifier 160 for a predetermined time (referred to as the current blanking time). Voltage at Vlfb_sen 162 is shown without blanking and with blanking between t1 181 and t2 182. The effects of the leading edge spike 170 on the amplifier 160 are blanked by controlling a voltage at the gate of the output blanking switch 183 during the current blanking time period. It is desirable that the current blanking time period is sufficient to cover delay associated with the gate driver 112 and the settling down time of the amplifier 160 under various process and temperature conditions. The delay unit 180 may be implemented as an analog circuit or a digital circuit.

Maintaining a particular duty cycle or a desired minimum duty cycle to provide the lowest programmable output voltage with the traditional current blanking circuit 100 with the delay unit 180 and an output blanking switch 180 may be difficult for all process and temperature corners. For example, a digital circuit implementation of the delay unit 180 often provides a predetermined, fixed delay time, and an analog circuit implementation using resistor and capacitor elements is inherently subject to parametric variations due to process and temperature conditions, which affect the delay time. In addition, implementation of the traditional current blanking circuit 100 is not area efficient since the delay unit 180 and the output blanking switch 180 utilize greater silicon area compared to another traditional circuit without the current blanking feature. Furthermore, as described earlier, the settling time of the amplifier 160, caused due to the initial current spike in the sense current, may vary with different process and temperature conditions.

SUMMARY

Applicants recognize that it would be desirable to provide a switching regulator that has an improved blanking time range compared to the traditional analog delay and digital delay based current blanking circuits, thereby enabling lower duty cycles and hence lower pulse widths. That is, it would be desired to match the duration of the blanking time with the duration of the leading edge spike. Applicants also recognize that it would be desirable if the gate drive signal provided to the sense FET is dynamically tracked across process and temperature variations. Applicants further recognize that it would be desirable to reduce a silicon area of the improved blanking time circuit compared to the traditional current blanking circuit.

Therefore, a need exists to provide an improved method and system for efficiently sensing a current in a switching regulator operating in a current mode. Additionally, a need exists for a new current sensing technique that has a configurable trigger mechanism to block out the leading edge current spike and provide an improved performance against variations in the process and temperature. Accordingly, it would be desirable to provide an improved DC-DC converter, absent the disadvantages found in the prior methods discussed above.

The foregoing needs are addressed by the teachings of the present disclosure, which relates to circuits and techniques used to sense current in switching regulators operating in a current mode. According to one embodiment, in a method and system for sensing current in a switching regulator (SWR) operating in a current mode, a power switch is coupled to receive the current from a switching element, the power switch being controlled by a gate signal. An inrush of the current causes an initial transient spike (ITS). A buffer having a buffer input and a buffer output is coupled to receive the gate signal and provide a buffered gate signal. The buffer output is disabled during the ITS. A sense switch (SW) is coupled to receive a portion of the current from the switching element, the SW being turned on by the buffered gate signal after the initial transient spike. A sense resistor (SR) is coupled to receive the portion of the current from the SW. An amplifier converts the portion of the current through the SR to a voltage signal for controlling the SWR.

In a particular embodiment, a method of sensing a current flowing through a power switch of a switching regulator includes turning on the power switch to enable the current to flow, the turning on causing an initial transient spike in the current. A sense switch is controlled to turn on after the occurrence of the initial transient spike, the sense switch being operable to sense a portion of the current.

Several advantages are achieved by the method and system according to the illustrative embodiments presented herein. The embodiments advantageously provide for an improved current sensing technique for use in switching regulators operating in a current mode. The new current sensing technique advantageously provides an improved blanking time range compared to the traditional analog delay and digital delay based current blanking circuits, thereby enabling lower duty cycles and hence lower pulse widths. In addition, the gate drive signal provided to the sense FET is dynamically tracked across process and temperature variations. Furthermore, the new technique advantageously reduces a silicon area of the improved blanking time circuit compared to the traditional current blanking circuit.

DETAILED DESCRIPTION

Figure 1A:
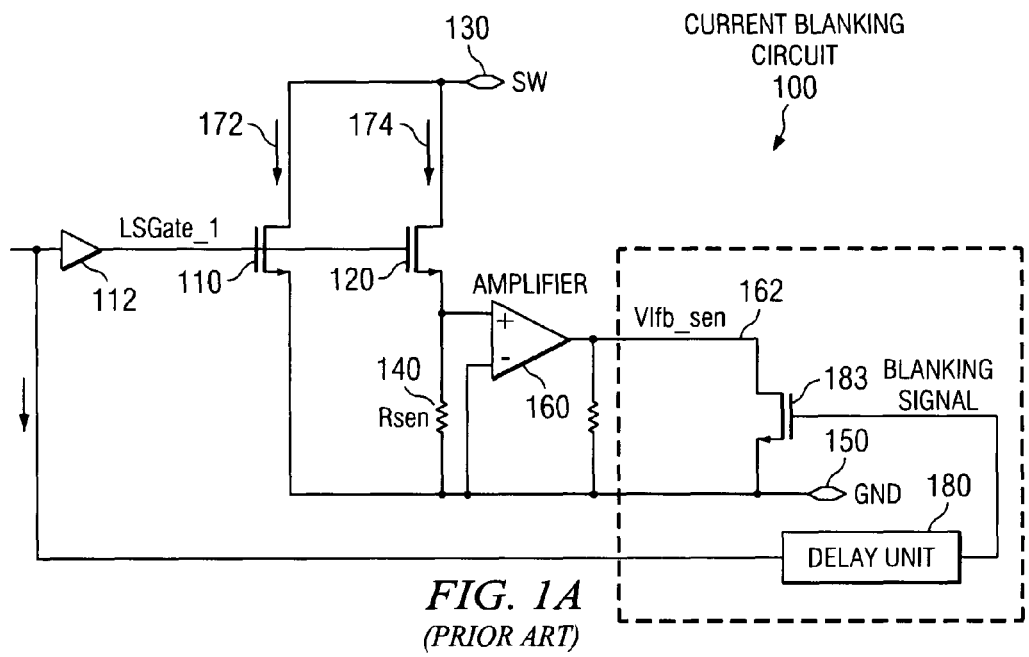
FIG. 1A illustrates a block diagram of a traditional current blanking circuit, described herein above, according to prior art.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, subassemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

As described earlier, a traditional solution based on a predetermined time delay used for current blanking may be unable to provide a desired duty cycle or provide a desired minimum pulse width of a switching regulator. It would be desired to reduce the blanking time range by better matching the duration of the blanking time with the duration of the leading edge spike. In addition, it would be desirable if the gate drive signal provided to the sense FET is dynamically tracked across process and temperature variations. Furthermore, it would be desirable to reduce a silicon area of the improved blanking time circuit compared to the traditional current blanking circuit.

These problems may be addressed by an improved DC-DC converter having an improved current sensing technique. In the improved system and method, the power FET and the sense FET are advantageously controlled by two gate signals that are selectively derived from the same gate signal. That is, during the presence of the initial transient current spike, the gate signal is modified, e.g., is blocked, and after the occurrence of the initial transient current spike, the gate signal is simply passed through. In contrast, in the traditional current blanking circuit 100, both the power FET 110 and the sense FET 120 are controlled by the same, unmodified gate signal. The gate signal provided to the power FET is also provided to a buffer element. The buffer element is operable to selectively enable or disable the gate signal from passing through. The buffer element has a greater threshold voltage compared to a Miller plateau voltage of the power FET, thereby enabling the buffer element to suppress its output from being provided to control the sense FET while the power FET is turned on and experiences the initial transient spike. The buffer element thus provides a configurable threshold voltage that is used to advantageously suppress transient current spike if the voltage level of the gate signal is less than the worst case Miller plateau voltage of the power switch or pass through the gate signal if the voltage level is greater than the worst case Miller plateau voltage of the power switch. The buffer element thus provides a configurable threshold voltage to turn on the sense FET, the configurable threshold voltage being greater than the Miller plateau voltage of the power FET. The threshold voltage being configured to be greater than the Miller plateau voltage advantageously suppresses the transient current spike since the current spike occurs when the voltage level of the gate signal is equal to Miller plateau voltage of the power FET.

According to one embodiment, in a method and system for sensing current in a switching regulator (SWR) operating in a current mode, a power switch is coupled to receive the current from a switching element, the power switch being controlled by a gate signal. An inrush of the current causes an initial transient spike (ITS). A buffer having a buffer input and a buffer output is coupled to receive the gate signal and provide a buffered gate signal. The buffer output is disabled during the ITS. A sense switch (SW) is coupled to receive a portion of the current from the switching element, the SW being turned on by the buffered gate signal after the initial transient spike. A sense resistor (SR) is coupled to receive the portion of the current from the SW. An amplifier converts the portion of the current through the SR to a voltage signal for controlling the SWR.

The following terminology may be useful in understanding the present disclosure. It is to be understood that the terminology described herein is for the purpose of description and should not be regarded as limiting.

Semiconductor Device—A semiconductor device is an electronic component that utilizes electronic properties of semiconductor materials to perform a desired function. A semiconductor device may be manufactured as a single discrete device or as one or more integrated circuits (ICs) packaged into a module.

System—One or more interdependent devices that co-operate to perform one or more predefined functions.

Configuration—Describes a set up of an element, a circuit, a package, an electronic device, and similar other, and refers to a process for setting, defining, or selecting particular properties, parameters, or attributes of the device prior to its use or operation. Some configuration attributes may be selected to have a default value. For example, a ratio of current flowing through a power FET and a sense FET may be configured to be equal to 1,000. That is, the sizes of the power FET and the sense FET may be selected so that if 1 ampere passes through the power FET then 1 milliamp would pass through the sense FET.

Miller plateau—Miller effect is a well known phenomenon caused by coupling between the output and the input of a transistor. A Miller plateau is a transition phase reached during a turn on as well as during a turn off sequence of a FET, in which a gate-to-source voltage $V_{GS}$ remains substantially constant or flat while the gate-to-drain parasitic capacitor $C_{GD}$ (and to a smaller extent, the gate-to-source parasitic capacitor $C_{GS}$) is being charged or discharged by a gate driver driving the gate of the FET. A full turn on of the FET is achieved once the $C_{GD}$ is fully charged and the $V_{GS}$ ramps up in response to the gate signal. A threshold voltage Vt of the FET is typically lower than the Miller plateau voltage.

An apparatus in the form of a current sensing circuit that is operable to deliver an improved performance compared to the traditional current blanking circuit 100 is described with reference to FIGS. 2, and 3. Various transient waveforms associated with the improved current blanking circuit are described with reference to FIG. 4. An electronic system that includes the improved current sensing circuit that is operable in a current mode to provide direct current (DC) power to a load is described with reference to FIG. 5. A method for sensing a current flowing through a power switch of a switching regulator is described with reference to FIGS. 6A and 6B.

Figure 2:
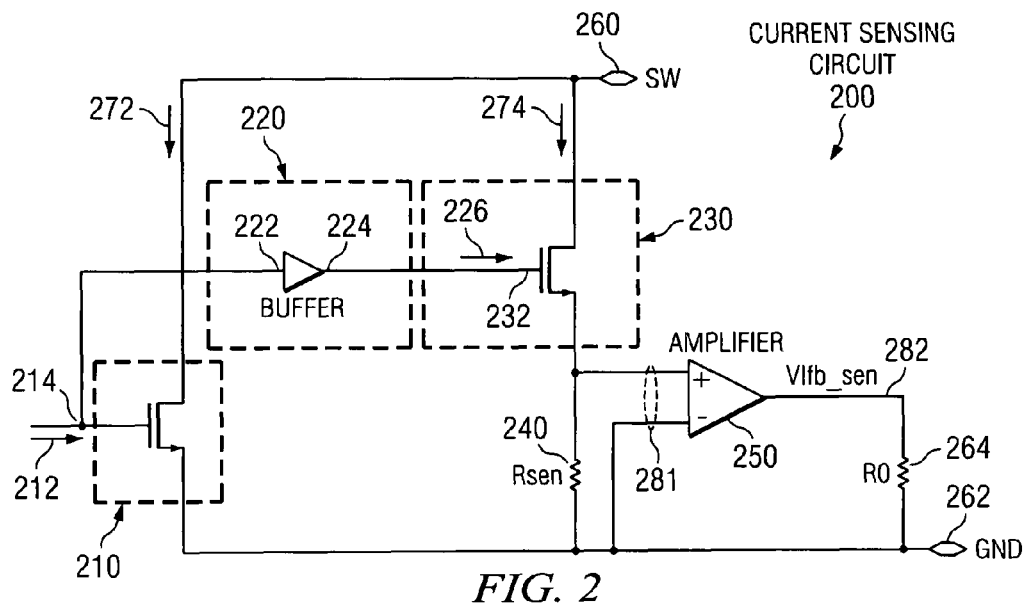
FIG. 2 illustrates a block diagram of a current sensing circuit, according to an embodiment.

FIG. 2 illustrates a block diagram of a current sensing circuit 200, according to an embodiment. In the depicted embodiment, the current sensing circuit 200 includes a power switch 210, a buffer 220, a sense switch 230, a sense resistor Rsen 240, and an amplifier 250. In a particular embodiment, the power switch 210 and the sense switch 230 may be implemented using a metal oxide semiconductor field effect transistor (MOSFET).

The power switch 210 is coupled in parallel with a combination of the sense switch 230 and the sense resistor Rsen 240. A drain of power switch 210 is coupled to a drain of the sense switch 230 both being coupled to a switching input node SW 260. A gate signal 212 received at a gate 214 controls the operation of the power switch 210. The buffer 220 includes a buffer input 222 and a buffer output 224. The buffer input 222 is coupled to the gate 214 to receive the gate signal 212. The buffer output 224 is coupled to a gate 232 of the sense switch 230. In response to receiving the gate signal 212 the buffer 220 provides a buffered gate signal 226 at the buffer output 224. A source of the power switch 210 is coupled to a ground reference 262, e.g., 0 volts. A voltage level at the switching input node SW 260 switches between an on state and an off state to store or discharge energy in an energy storage element such as an inductor (not shown). The sense resistor Rsen 240 is coupled in series between a source of the sense switch 230 and the ground reference 262.

When both the power switch 210 and the sense switch 230 are turned on, current flows through the parallel paths, the current being divided in proportion to the impedance of each path, e.g., proportional to the on-resistance of the power switch 210 and the combined resistance of the sense resistor Rsen 240 and the on-resistance of the sense switch 230. A current 272 flowing through the power switch 210 (may also be referred to as the power current 272) is typically much greater than a current 274 flowing through the sense switch 230 (may also be referred to as the sense current 274), e.g., by a factor of thousands. In a particular embodiment, the power switch 210 and the sense switch 230 are properly sized and matched to achieve the desirable ratio of power current 272 to the sense current 274. In addition, it is desirable to match the gate-to-source voltage Vgs for the sense switch 230 and the power switch 210, thereby ensuring the sense current 274 properly and proportionately tracks the power current 272. A mismatch in the Vgs may result in an improper sensing of the current 272. An amplifier 250 includes a pair of inputs 281 to measure a voltage across Rsen 240 and provides a voltage output signal at an output node Vlfb_sen 282. The amplifier 250 thus converts the current 274 flowing through the sense switch 230 into the voltage output signal at the output node Vlfb_sen 282. The voltage output signal is also indicative of the current 272 flowing through the power switch 210 based on the ratio of the impedances of the parallel paths. An output resistance R0 264 is coupled between the output node Vlfb_sen 282 and the ground reference 262.

When turned on, the power switch 210 experiences an initial transient spike in the current 272, whereas the sense switch 230 is advantageously shielded by the buffer 220 from experiencing a similar initial transient spike in the current 274. As described earlier, the buffer 220 is operable to selectively enable or disable the gate signal 212 from passing through, thereby selectively controlling the operation of the sense switch 230. The buffer 220 is capable of selectively enabling or disabling the gate signal 212 from passing through without an additional control signal. The buffer 220 has a greater input high threshold (Vih) voltage compared to a worst case Miller plateau voltage of the power switch 210, thereby enabling the buffer 220 to block the buffered gate signal 226 at the buffer output 224 from being provided to control the sense switch 230, while the power switch 210 is turned on and is subject to the initial transient spike. The buffer 220 thus provides a configurable threshold voltage to turn on the sense switch 230, the configurable threshold voltage being greater than the Miller plateau voltage of the power switch 210. The threshold voltage being configured to be greater than the Miller plateau voltage advantageously suppresses the transient current spike through the channel of the power switch 210 since the current spike occurs when the voltage level of the gate signal 212 is equal to Miller plateau voltage of the power switch 210. Thus, the initial transient spike is substantially subsided by the time the buffer 220 is triggered to provide the buffered gate signal 226 that enables the sense switch 230 to turn on. Additional detail of the buffer 220 is described with reference to FIG. 3. Additional detail of the transient waveforms and the timing aspects of the current sensing circuit 200 are described with reference to FIG. 4.

Figure 1B:
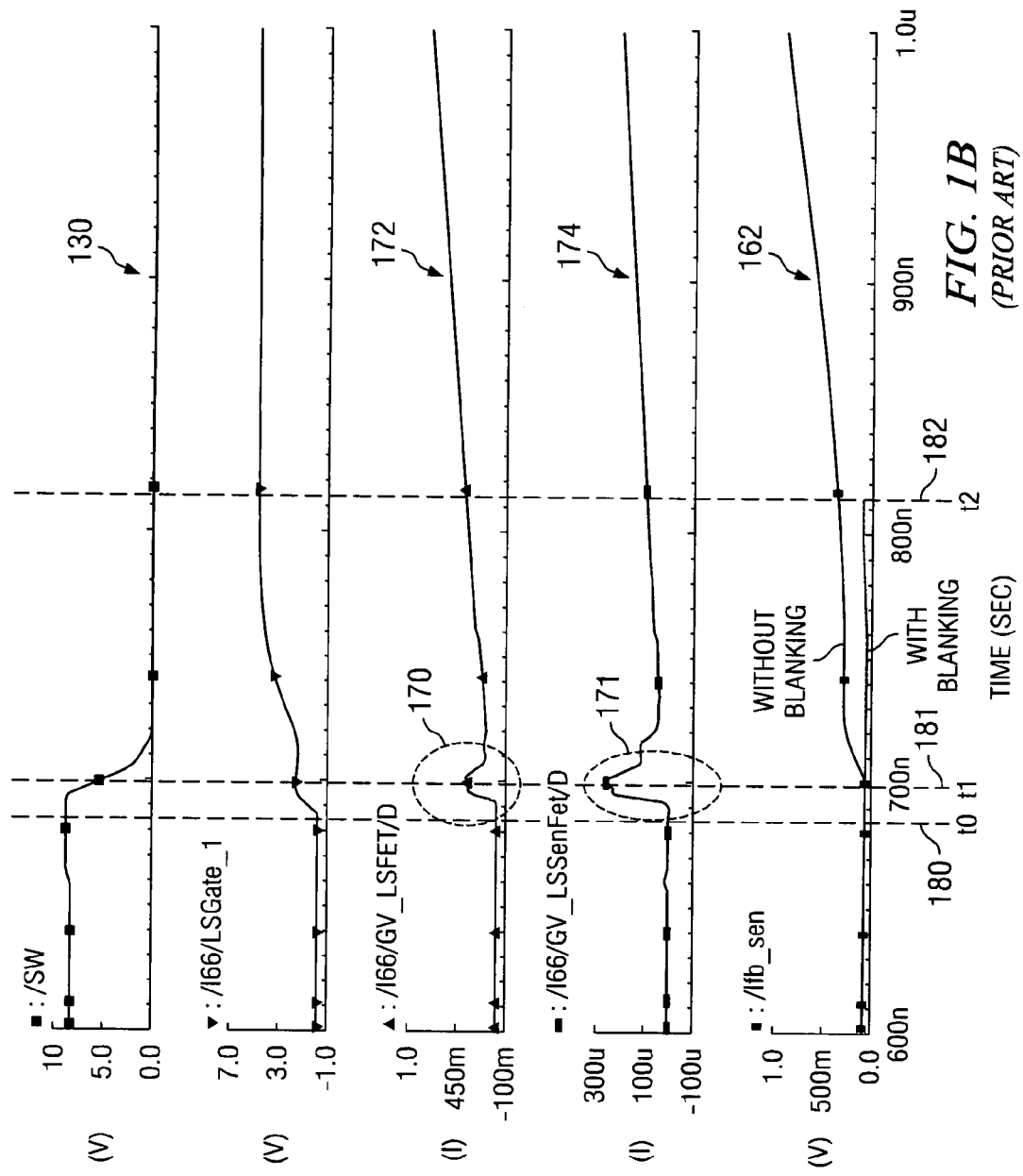
FIG. 1B illustrates transient waveforms associated with a traditional current blanking circuit described herein above with reference to FIG. 1A, according to prior art.

By eliminating a need for the delay unit 180 and the output blanking switch 183 described with reference to FIGS. 1A and 1B and adding the buffer 220, a silicon area to implement the current sensing circuit 200 is advantageously reduced compared to a silicon area to implement the traditional current blanking circuit 100.

Figure 3:
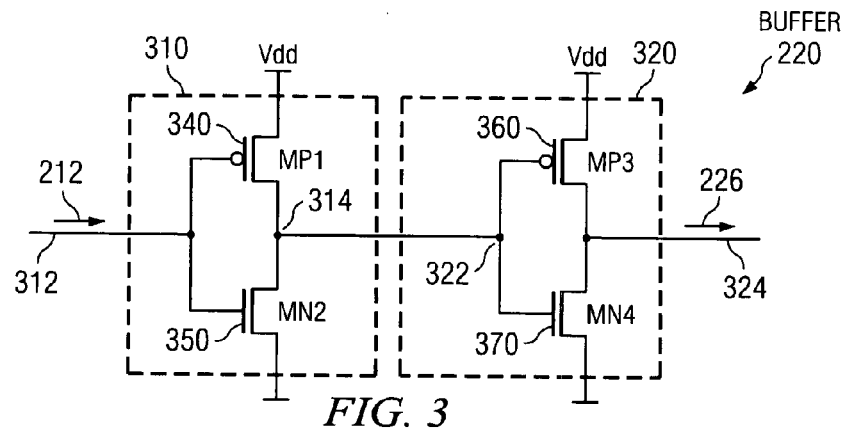
FIG. 3 illustrates additional detail of a buffer described with reference to FIG. 2, according to one embodiment.

FIG. 3 illustrates additional detail of the buffer 220 described with reference to FIG. 2, according to an embodiment. In the depicted embodiment, the buffer 220 is implemented as a two stage inverter, which includes a first inverter 310 coupled to a second inverter 320. That is, the buffer 220 includes the first inverter 310 having a first inverter input 312 coupled to receive the gate signal 312 and provide a first inverter output 314. The first inverter output 314 is coupled to a second inverter input 322 of the second inverter 320. The second inverter 320 provides a second inverter output 324 in response to the second inverter input 322. The second inverter output 324 is the buffer output 224, which provides the buffered gate signal 226 to control the sense switch 230.

In the depicted embodiment, the first inverter 310 includes a first p-MOS transistor MP1 340 and a second n-MOS transistor MN2 350 and the second inverter 320 includes a third p-MOS transistor MP3 360 and a fourth n-MOS transistor MN4 370. The first inverter input 312 is coupled to the gates of the MP1 340 and MN2 350, the drains of the MP1 340 and MN2 350 are coupled to form the first inverter output 314. Similarly, the second inverter input 322, which is coupled to the first inverter output 314, is coupled to the gates of MP3 360 and MN4 370. The drains of MP3 360 and MN4 370 are coupled to form the second inverter output 324.

In a particular embodiment, MP1 340 and MN2 350 are properly sized and their ratio is configured to disable the first inverter output 314 when the gate signal 212 is less than the input high threshold (Vih) voltage, the Vih being configured to be greater than the worst case Miller plateau voltage of the power switch 210. The worst case Miller plateau voltage may be selected based on three sigma data collected during the fabrication of the power switch 210 under various process and temperature conditions. In a particular embodiment, the first inverter 310 may be configured to have a Vih voltage between approximately 2.0 volts to approximately 2.5 volts. The second inverter output 324 is disabled in response to the first inverter output 314 being disabled when the gate signal 212 is less than Vih voltage.

Figure 4:
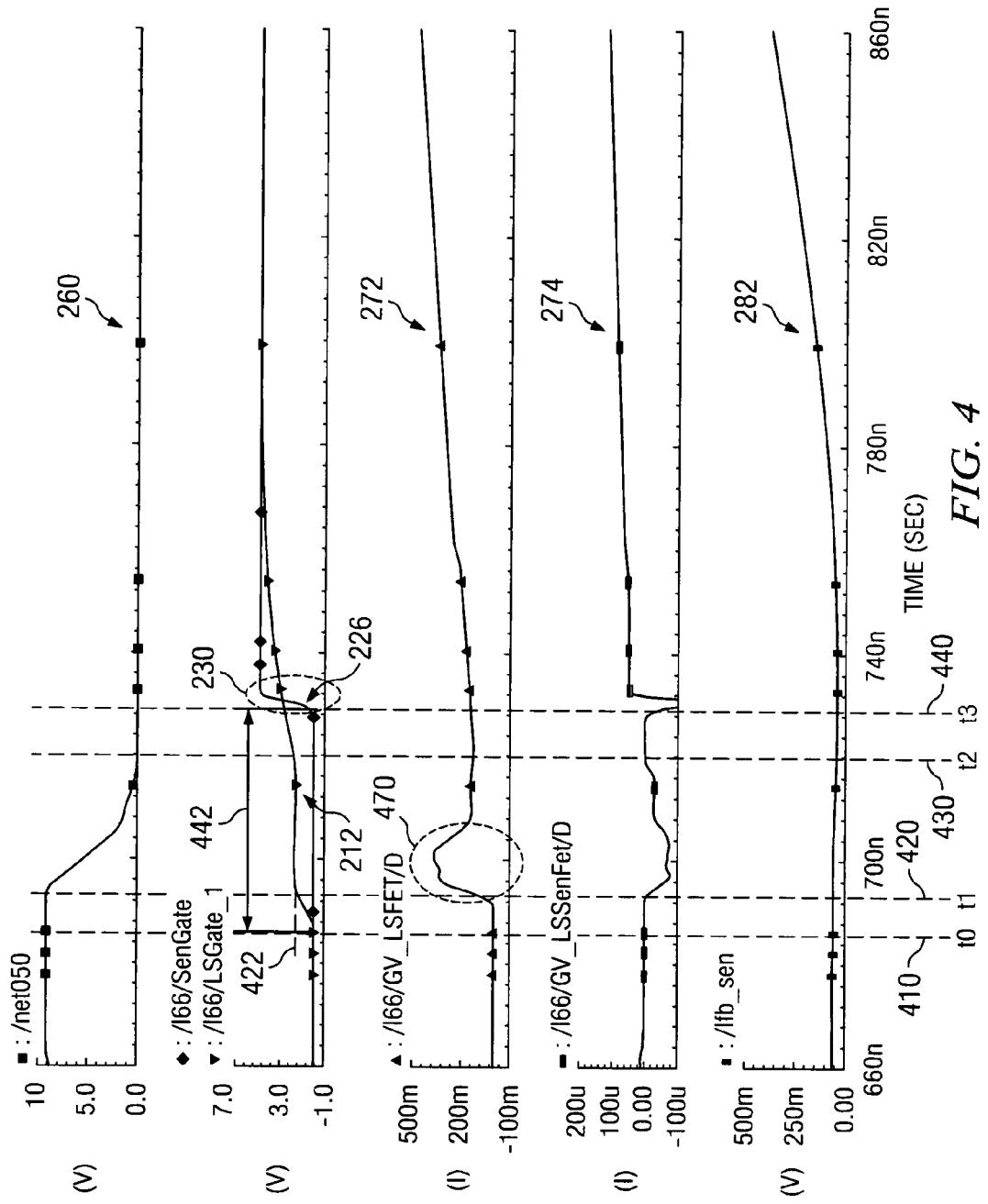
FIG. 4 illustrates transient waveforms associated with a current sensing circuit described with reference to FIGS. 2 and 3, according to one embodiment.

FIG. 4 illustrates transient waveforms associated with the current sensing circuit 200 described with reference to FIGS. 2 and 3, according to an embodiment. In a particular embodiment, the data associated with the transient waveforms of various voltages and currents of the current sensing circuit 200 is derived by conducting various types of tests (e.g., laboratory tests, empirical tests, tests using simulation tools, and similar others).

Referring to FIGS. 2, 3, and 4, at time t0 410 when the power switch 210 is turned on, there is a leading edge spike 470 on the waveform of the current 272 flowing through the power switch 210. As described earlier, the leading edge spike 470 is caused by the presence of parasitic capacitances and by the reverse recovery phenomenon associated with the FET switches. The buffer 220 advantageously blocks the leading edge spike 470 from passing through to the sense switch 230. As such, there is no corresponding leading edge spike on the waveform of the current 274.

Between time t1 420 and time t2 430 a gate-to-source voltage of the power switch 210 is substantially flat, exhibiting a Miller plateau 422 associated with the power switch 210. At time t3 440 when a voltage level of the gate signal 212 reaches the input high threshold voltage (greater than the worst case voltage of the Miller plateau 422) the buffer 220 passes through the gate signal 212 as the buffered gate signal 226 and turns on the sense switch 230. Also at time t3 440, when the sense switch 230 is turned on, the sense current 274 starts flowing through the sense switch 230 and is proportional to the current 272 flowing through the power switch 210.

A time period between time t0 410 and time t3 440 is described as a current blanking time 442. The leading edge spike 470 is substantially subsided during the current blanking time 442. That is, a width of the leading edge spike 470 is less than the current blanking time 442. The current blanking time 442, during which the sensing of the current 272 is disabled, is advantageously reduced compared to the traditional current blanking circuit 100 since the current blanking time 442 is not arbitrarily set or defined and is less vulnerable to process and temperature variations. For example, at time t3 440 (approximately equal to 730 nanoseconds on the time scale) the voltage output at the output node Vlfb_sen 282 is stable and is indicative of the current 274 flowing through the sense switch 230, and hence of the current 272 flowing through the power switch 210. In contrast, voltage signal at the output Vlfb_sen 162 of the amplifier 160 is unstable due to the presence of the leading edge spike 170 and takes a longer time to settle, e.g., output signal appears to settle past 800 nanoseconds on the time scale. Thus, as described earlier, the current sensing circuit 200 provides improved blanking time range compared to the traditional analog delay and digital delay based current blanking circuits, e.g., time range is reduced from 800 nanoseconds to less than 730 nanoseconds. In addition, the current blanking time 442 is optimally configured since the turning on of the current sensing by the sense switch 230 is based on the worst case Miller plateau 422 (thereby automatically accommodating various process and temperature conditions).

The sense current 274 flowing through the sense switch 230 between time t0 410 and time t3 440 is ideally equal to 0 amperes but may exhibit transient variation around 0 amperes due to the presence of parasitic capacitances and noise. Until time t3 440, the measured voltage across Rsen 240 is substantially equal to zero since the current 274 is substantially equal to zero and the output voltage provided by the amplifier 250 at the output node Vlfb_sen 282 is also substantially equal to 0 volts.

Figure 5:
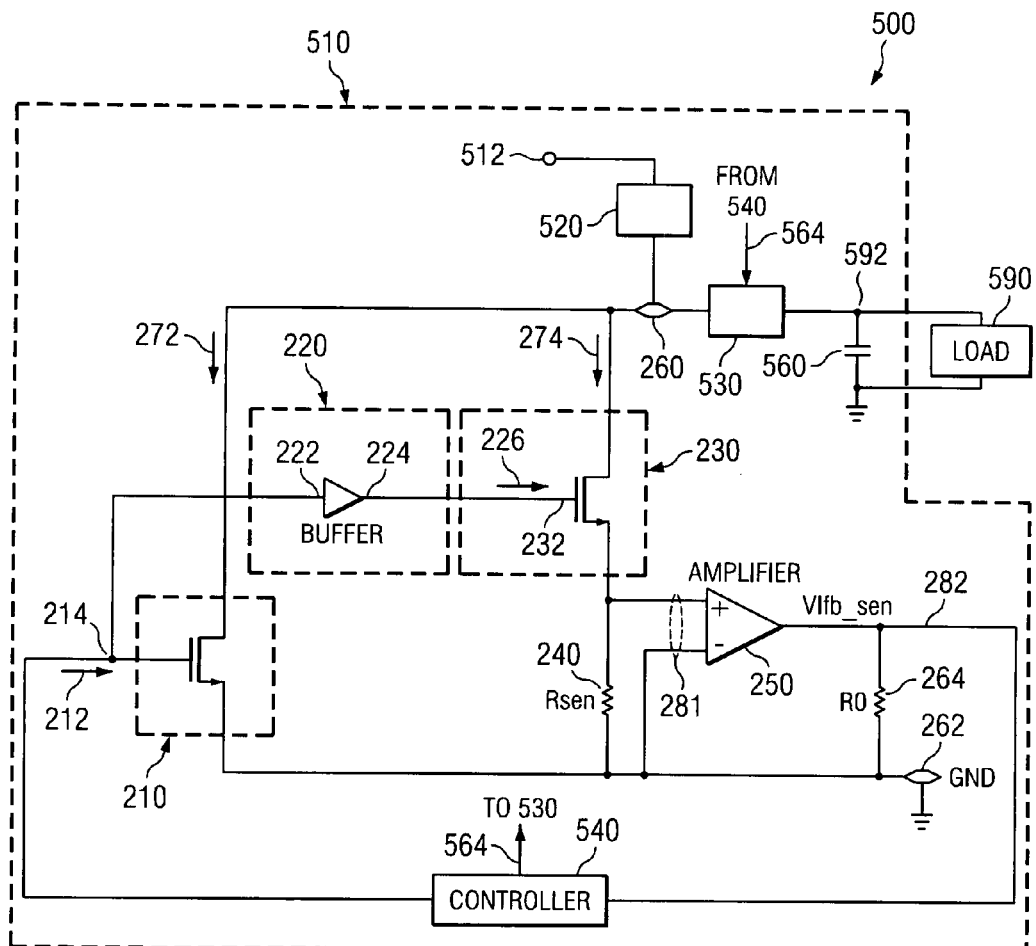
FIG. 5 is a block diagram of an electronic system that is operable to provide power to a load, according to one embodiment.

FIG. 5 is a block diagram of an electronic system 500 that is operable to provide power to a load 590, according to an embodiment. In the depicted embodiment, the electronic system 500 includes a switching regulator 510 providing power to the load 590. The switching regulator 510 includes an energy storage element 520, e.g., an inductor, coupled to receive a DC voltage input signal at an input terminal 512, the current sensing circuit 200 described with reference to FIG. 2, a high side power switch 530 coupled in series between the energy storage element 520 and an output 592, a controller 540 operable to control the switching regulator 510 in various control modes including a current mode, and an output capacitor 560 coupled in parallel with the load 590.

The switching regulator 510 regulates an average DC output voltage at the output 592 by selectively storing energy in the energy storing element 520 such as the inductor during a charge cycle, e.g., during an on time of the power switch 210. The energy stored in the energy storage element 520 is selectively transferred to charge the output capacitor 560 in discrete packets during a discharge cycle, e.g., during an off time of the switching element. Thus, the charge and discharge cycles are controlled by the controller 540 by sensing the current flowing through the energy storage element 520 and by adjusting the on time and off time of the power switch 210 and the high side power switch 530.

In a particular embodiment, the controller 540 controls the operation (e.g., on or off control) of the power switch 210 by asserting (or high) or deasserting (or low) the gate signal 212 provided to the power switch 210 and controls the high side power switch 530 by asserting (or high) or deasserting (or low) a control signal 564 provided to the high side power switch 530 in response to receiving the output voltage signal from the output node Vlfb_sen 282. The timing of the power switch 210 and the high side power switch 530 are complementary to one another. That is, when the power switch 210 is turned on, the high side power switch 530 is turned off and vice versa. The load 590 receives the current from the output capacitor 560 during an on time of the power switch 210 and from the high side power switch 530 during the off time of the power switch 210.

In a particular embodiment, each one of the power switch 210, the sense switch 230, and the high side power switch 530 is implementable as a MOSFET device. It is understood that the switching regulator 510 may be implemented in various topologies and configurations. In an embodiment, the switching regulator 510 is a DC-DC converter that operates in a current sense mode. In an embodiment, the DC-DC converter is one of a boost converter, a buck converter, a buck-boost converter, and a Cuk converter or a combination thereof. In a particular embodiment, the load 590 is at least one of a microprocessor, an application specific integrated circuit (ASIC), a digital signal processor, a radio frequency chip, a memory, a microcontroller, and a system-on-a-chip, or a combination thereof.

Figure 6A:
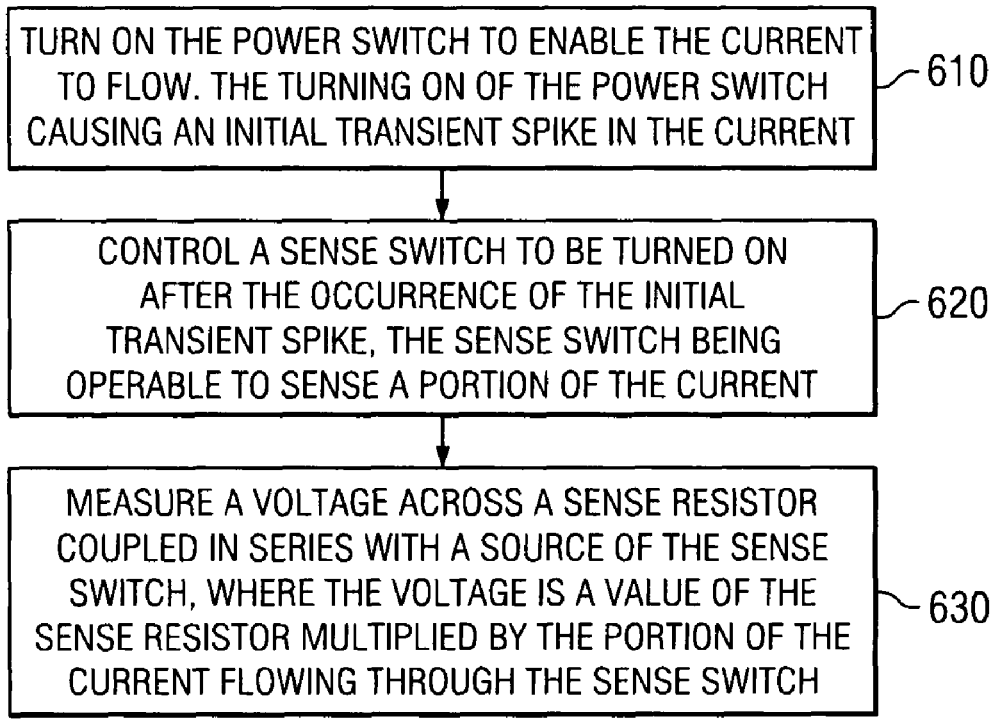
FIG. 6A is a flow chart illustrating a method of sensing a current flowing through a power switch of a switching regulator, according to an embodiment.

FIG. 6A is a flow chart illustrating a method of sensing a current flowing through a power switch of a switching regulator, according to an embodiment. In a particular embodiment, the method is used to sense the current 272 flowing through the power switch 210 of the current sensing circuit 200 described with reference to FIG. 2. At step 610, the power switch is turned on to enable the current to flow. The turning on of the power switch causes an initial transient spike in the current. At step 620, a sense switch is controlled to be turned on after the occurrence of the initial transient spike, the sense switch being operable to sense a portion of the current. At step 630, a voltage across a sense resistor coupled in series with a source of the sense switch is measured, where the voltage is a value of the sense resistor multiplied by the portion of the current flowing through the sense switch.

Various steps described above may be added, omitted, combined, altered, or performed in different orders. For example, in a particular embodiment, controlling the sense switch to turn on at step 620 may include performing steps 6202 and 6204 described in FIG. 6B.

Figure 6B:
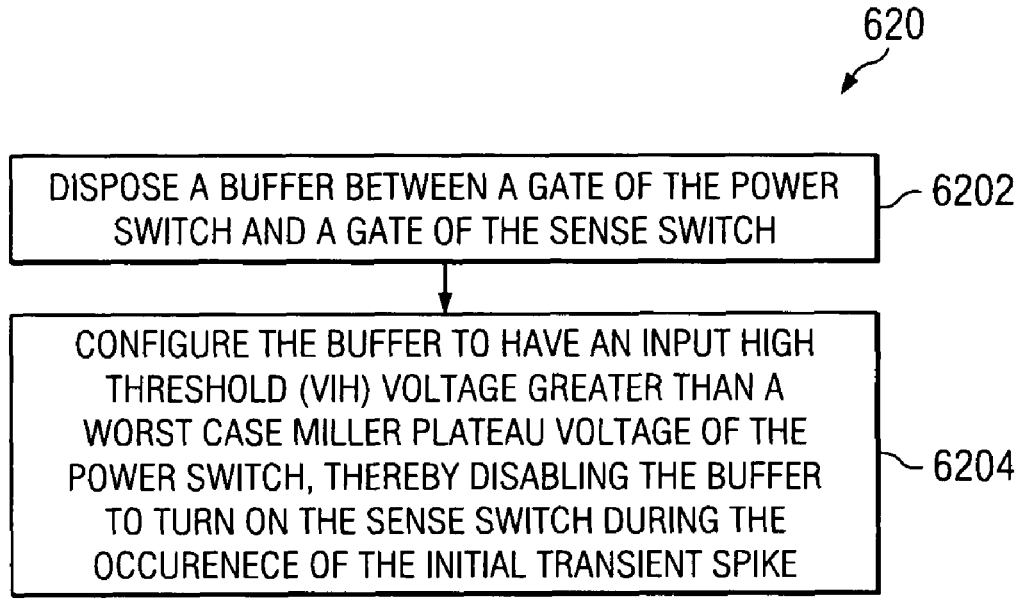
FIG. 6B is a flow chart illustrating a method of controlling a sense switch to turn on, according to an embodiment.

FIG. 6B is a flow chart illustrating a method of controlling a sense switch to turn on, according to an embodiment. At step 6202, a buffer is disposed between a gate of the power switch and a gate of the sense switch. At step 6204, the buffer is configured to have an input high threshold (Vih) voltage greater than a worst case Miller plateau voltage of the power switch, thereby disabling the buffer to turn on the sense switch during the occurrence of the initial transient spike. Various steps described above may be added, omitted, combined, altered, or performed in different orders.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of the system 100 having one or more devices, those of ordinary skill in the art will appreciate that the systems and processes disclosed are capable of being implemented using hardware, software, and firmware components including systems-on-a-chip (SoC) or a combination thereof.

The methods and systems described herein provide for an adaptable implementation. Although certain embodiments have been described using specific examples, it will be apparent to those skilled in the art that the invention is not limited to these few examples. For example, the current sensing technique is described with reference to a boost type DC-DC converter has been described, those of ordinary skill in the art will appreciate that the apparatus and methods disclosed herein are applicable to any switching regulator operating in a current mode. It is understood that additional DC-DC converter types such as buck, buck-boost, Cuk and others may be similarly current controlled to improve performance against leading edge current spike, and for reducing silicon area. As another example, the various switches have been described to be implemented as a MOSFET device, those of ordinary skill in the art will appreciate that the apparatus and methods disclosed herein are capable of being implemented using similar other semiconductor devices.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A current sensing circuit comprising:
a power switch coupled to receive a current from a switching input, the power switch being controlled by a gate signal, wherein a turn on of the power switch causes the current to have an initial transient spike;
a buffer having a buffer input and a buffer output, the buffer input being coupled to receive the gate signal and provide a buffered gate signal at the buffer output;
a sense switch coupled to receive a portion of the current from the switching input, the sense switch being turned on by the buffered gate signal after the initial transient spike, wherein the buffer is configured to not turn on the sense switch on when the gate signal is less than an input high threshold (Vih) voltage, the Vih being configured to be greater than a Miller plateau voltage of the power switch to avoid the initial transient spike; and
a sense resistor coupled to receive the portion of the current from the sense switch.

2. The current sensing circuit of claim 1, wherein the buffer includes:
a first inverter having a first inverter input and a first inverter output, wherein the first inverter input is coupled to the buffer input, and is configured to not generate a signal at the first inverter output to turn on the sense switch when the gate signal is less than a worst case Miller plateau voltage of the power switch; and
a second inverter having a second inverter input and a second inverter output, wherein the second inverter input is coupled to the first inverter output and the second inverter output is coupled to the buffer output.

3. The current sensing circuit of claim 1, wherein a ratio of the portion of the current flowing through the sense switch and the current flowing through the power switch is proportional to an on-resistance of the power switch and a combined resistance of the sense resistor and an on-resistance of the sense switch.

4. The current sensing circuit of claim 1 further comprising:
an amplifier having a pair of inputs and a voltage output, wherein the pair of inputs are coupled across the sense resistor, wherein a voltage provided at the voltage output is proportional to the current.

5. The current sensing circuit of claim 1, wherein a time difference between the power switch being turned on and the sense switch being turned on is a current blanking time, wherein the initial transient spike subsides during the current blanking time.

6. The current sensing circuit of claim 1, wherein the current sensing circuit is included in a switching regulator operating in a current mode, wherein the switching regulator is a DC-DC converter.

7. The current sensing circuit of claim 6, wherein the DC-DC converter is one of a boost converter, a buck converter, a buck-boost converter, and a Cuk converter or a combination thereof.

8. A method of sensing a current flowing through a power switch of a switching regulator, the method comprising: turning on the power switch to enable the current to flow, the turning on causing an initial transient spike in the current; controlling a sense switch to turn on after the occurrence of the initial transient spike, the sense switch being operable to sense a portion of the current; wherein the controlling includes: disposing a buffer between a gate of the power switch and a gate of the sense switch; and configuring the buffer to have an input high threshold (Vih) voltage greater than a worst case Miller plateau voltage of the power switch, thereby disabling the buffer to turn on the sense switch during the occurrence of the initial transient spike.

9. In the method of claim 8 further comprising:
measuring a voltage across a sense resistor coupled in series with a source of the sense switch, wherein the voltage is a value of the sense resistor multiplied by the portion of the current flowing through the sense switch.

10. In the method of claim 8, wherein a combination of the sense switch and the sense resistor is coupled in parallel with the power switch.

11. In the method of claim 8, wherein a time difference between the power switch being turned on and the sense switch being turned on is a current blanking time, wherein the initial transient spike subsides during the current blanking time.

12. In the method of claim 8, wherein the switching regulator is a DC-DC converter.

13. In the method of claim 12, wherein the DC-DC converter is one of a boost converter, a buck converter, a buck-boost converter, and a Cuk converter or a combination thereof.

14. An electronic system comprising:
a load; and
a switching regulator operable to provide power to the load, the switching regulator including:
an energy storage element coupled to receive a voltage input at an input terminal;
a current sensing circuit including:
a power switch coupled to receive a current from the energy storage element, the power switch being controlled by a gate signal, wherein an inrush of the current causes an initial transient spike;
a buffer having a buffer input and a buffer output, the buffer input being coupled to receive the gate signal and provide a buffered gate signal at the buffer output;
a sense switch coupled to receive a portion of the current from the energy storage element, the sense switch being turned on by the buffered gate signal after the initial transient spike;
a sense resistor coupled to receive the portion of the current from the sense switch;
an amplifier operable to convert the portion of the current through the sense resistor to a feedback signal;
a controller coupled to receive the feedback signal derived as a function of the current flowing through the energy storage element, wherein the controller provides the gate signal in response to the feedback signal.

15. The system of claim 14, wherein the load is at least one of a microprocessor, an application specific integrated circuit (ASIC), a digital signal processor, a radio frequency chip, a memory, a microcontroller, and a system-on-a-chip, or a combination thereof.

16. The system of claim 14, wherein the switching regulator is a DC-DC converter, wherein the DC-DC converter is one of a boost converter, a buck converter, a buck-boost converter, and a Cuk converter or a combination thereof.

17. The system of claim 14, wherein a time difference between the power switch being turned on and the sense switch being turned on is a current blanking time.

* * * * *